United States Patent [19]
Ochiai

[11] Patent Number: 6,043,526
[45] Date of Patent: Mar. 28, 2000

[54] SEMICONDUCTOR MEMORY CELL USING A FERROELECTRIC THIN FILM AND A METHOD FOR FABRICATING IT

[75] Inventor: Akihiko Ochiai, Kanagawa, Japan

[73] Assignee: Sony Corporation, Tokyo, Japan

[21] Appl. No.: 08/995,841

[22] Filed: Dec. 22, 1997

[30] Foreign Application Priority Data

Dec. 26, 1996 [JP] Japan .................................. 8-348380
Jul. 31, 1997 [JP] Japan .................................. 9-205798

[51] Int. Cl.[7] .......................... H01L 29/76; H01L 29/94; H01L 31/062; H01L 31/113
[52] U.S. Cl. ............................................................. 257/295
[58] Field of Search ............................................. 257/295

[56] References Cited

U.S. PATENT DOCUMENTS 5,499,207  3/1996  Miki et al. .

*Primary Examiner*—Stephen D. Meier
*Attorney, Agent, or Firm*—Hill & Simpson

[57] ABSTRACT

A capacitor structure of a semiconductor memory cell, comprises: a lower electrode formed on an insulation layer; a capacitor insulation film in form of a ferroelectric thin film formed on the lower electrode; and an upper electrode formed on the capacitor insulation layer, the lower electrode including a column-shaped projection made of a conductive material formed on the insulation layer, and a lower electrode layer covering the projection, and the ferroelectric thin film being formed on the lower electrode layer as originally stacked. A method for fabricating a capacitor structure of a semiconductor memory cell, comprises the steps of: forming a conductive material layer on an insulation layer, then patterning the conductive material layer to form a column-shaped projection of a conductive material on the insulation layer; stacking a lower electrode layer on the insulation layer including the surface of the column-shaped projection; stacking a ferroelectric thin film on the lower electrode layer as originally stacked; stacking an upper electrode layer on the ferroelectric thin film; and patterning the lower electrode layer, the ferroelectric thin film and the lower electrode layer to form a capacitor structure including a lower electrode, a capacitor insulation film in form of the ferroelectric thin film, and an upper electrode.

12 Claims, 7 Drawing Sheets

SEMICONDUCTOR MEMORY CELL USING A FERROELECTRIC THIN FILM AND A METHOD FOR FABRICATING IT

BACKGROUND OF THE INVENTION

1. Field of the Invention

This invention relates to a capacitor structure in a semiconductor memory cell using a ferroelectric thin film and a method for fabricating it, and more specifically, to a capacitor structure in a semiconductor memory cell in form of a nonvolatile memory cell (called FERAM) or DRAM using a ferroelectric thin film and a method for fabricating it.

2. Description of the Related Art

Laborious researches for applications of nonvolatile memory using ferroelectric thin films have been progressed recently along with developments in film making technologies. Nonvolatile memory utilizes quick inversion of polarization and residual polarization of a ferroelectric thin film, and permits high-speed rewriting. Nonvolatile memory devices using ferroelectric films under current researches can be classified into a group relying on detection of changes in amount of electric charge accumulated in a ferroelectric capacitor and another group relying on detection of changes in resistance of a semiconductor caused by spontaneous polarization of a ferroelectric material. The invention relates to a semiconductor memory cell belonging to the former group.

Figure 1:
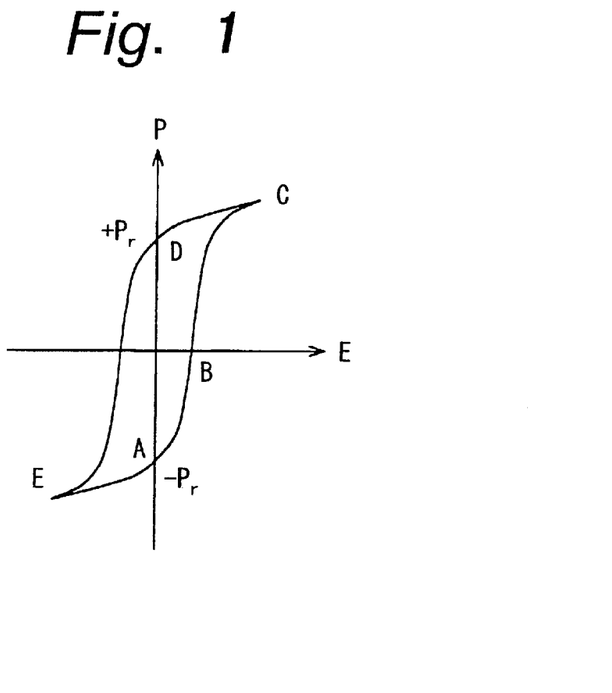
FIG. 1 is a P-E hysteresis loop diagram of a ferroelectric material.

Nonvolatile memory cells configured to detect changes in accumulated electric charge in a ferroelectric capacitor basically comprises a ferroelectric capacitor and a selection transistor. The ferroelectric capacitor is made of a lower electrode, upper electrode, and a ferroelectric thin film between the electrodes. Writing and reading data with a nonvolatile memory cell of this type relies on a P-E hysteresis loop of the ferroelectric material as shown in FIG. 1. When an external electric field is applied to and then removed from the ferroelectric thin film, the ferroelectric thin film exhibits spontaneous polarization. The residual polarization of the ferroelectric thin film becomes $+P_r$ when a plus external field is applied, and becomes $-P_r$ when a minus external field is applied. The state where the residual polarization is $+P_r$ (see D in FIG. 1) is determined as "0", and the state where the residual polarization is $-P_r$ (see A in FIG. 1) is determined as "1".

For discriminating whether the state is "1" or "0", a plus external field, for example, is applied to the ferroelectric thin film. As a result, polarization of the ferroelectric thin film is changed to the state "C" in FIG. 1. Then, if data is "0", polarization of the ferroelectric thin film changes from "D" to "C". If data is "1", polarization of the ferroelectric thin film changes from "A" through "B" to "C". When data is "0", polarization of the ferroelectric thin film is not inverted. When data is "1", inversion of polarization occurs in the ferroelectric thin film. As a result, a difference is produced in amount of moving charge in response to a difference in accumulated electric charge (state of polarization) in the ferroelectric capacitor. By turning on the selection transistor of a selected memory cell, the accumulated electric charge is detected as a bit line potential. When the external electric field is changed to 0 after data is read out, the state of polarization of the ferroelectric thin film becomes "D" in FIG. 1 whichever of "0" and "1" is the data. Therefore, when the data is "1", a minus external electric field is applied to change the state from "D" through "E" to "A" permitting data "1" to be written.

Figure 2:
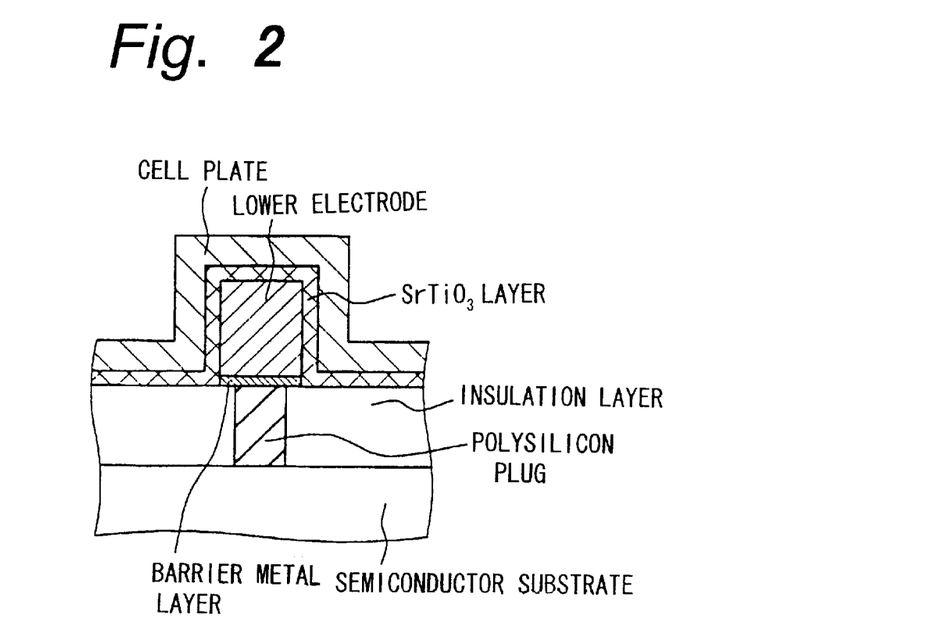
FIG. 2 is a schematic fragmentary cross-sectional view of a conventional DRAM.

In order to realize higher integration of nonvolatile semiconductor memory, the area of the ferroelectric thin film must be increased. In DRAMs, a high dielectric thin film similar to the ferroelectric thin film currently used in nonvolatile semiconductor memory will be used when a high integration around 1 Gbits is desired, and there are various proposals for its capacitor structure. For example, a pedestal-type DRAM using $SrTiO_3$ as a high dielectric thin film is known from the literature "A Gbit-scale DRAM stacked capacitor technology with ECR MOCVD $SrTiO_3$ and RIE patterned $RuO_2$/TiN storage nodes", P-Y Lesaicherre, et al., IEDM 94–841, 34.1.1. In a DRAM cell disclosed by the literature, as schematically shown in a fragmentary cross-sectional view of FIG. 2, the lower electrode made of $RuO_2$ has the form of a column patterned by RIE. By using the column-shaped lower electrode, the area of the high dielectric thin film covering the lower electrode can be increased.

In a DRAM using a high dielectric thin film, accumulated charge and applied voltage have a linear relationship. In contrast, in a semiconductor memory cell using a ferroelectric thin film, accumulated electric charge and applied voltage are non-linearly related as shown in FIG. 1, and the memory cell has a hysteresis characteristics. Additionally, the characteristic of the ferroelectric thin film is sensitive to the surface condition of the lower electrode. If the technique shown in the above-introduced literature is applied to a semiconductor memory cell using a ferroelectric thin film, that is, if the ferroelectric thin film is formed on the lower electrode in form of a column patterned by RIE, the characteristic of the ferroelectric thin film will be degraded because the surface of the lower electrode of this type is usually coarse due to damages and usually exhibits a bad surface morphology.

OBJECTS AND SUMMARY OF THE INVENTION

It is therefore an object of the invention to provide a capacitor structure in a semiconductor memory cell using a ferroelectric thin film and a method for fabricating it, which can increase the area of a ferroelectric thin film and prevents degradation of characteristics of the ferroelectric thin film by surface conditions of a lower electrode.

According to a first aspect of the invention, there is provided a capacitor structure of a semiconductor memory cell, comprising:

(a) a lower electrode formed on an insulation layer;

(b) a capacitor insulation film in form of a ferroelectric thin film formed on the lower electrode; and (c) an upper electrode formed on the capacitor insulation layer, the lower electrode including a column-shaped projection made of a conductive material formed on the insulation layer, and a lower electrode layer covering the projection, and the ferroelectric thin film being formed on the lower electrode layer as originally stacked.

According to a second aspect of the invention, there is provided a method for fabricating a capacitor structure of a semiconductor memory cell, comprising the steps of:

(a) forming a conductive material layer on an insulation layer, then patterning the conductive material layer to form a column-shaped projection of a conductive material on the insulation layer;

(b) stacking a lower electrode layer on the insulation layer including the surface of the column-shaped projection;

(c) stacking a ferroelectric thin film on the lower electrode layer as originally stacked;

(d) stacking an upper electrode layer on the ferroelectric thin film; and (e) patterning the lower electrode layer, ferroelectric thin film and lower electrode layer to form a capacitor structure including a lower electrode, a capacitor insulation film in form of the ferroelectric thin film, and an upper electrode.

Shown below are sequences of stacking and patterning the lower electrode layer, ferroelectric thin film and upper electrode layer, which all are versions of the method for fabricating a capacitor structure in a semiconductor memory cell according to the invention.

(A) sequentially stacking the lower electrode layer, ferroelectric thin film and upper electrode layer, and simultaneously patterning the upper electrode layer, ferroelectric thin film and lower electrode layer;

(B) stacking and patterning the lower electrode layer, sequentially stacking the ferroelectric thin film and the upper electrode layer, and simultaneously patterning the upper electrode layer and the ferroelectric thin film; and (C) stacking and patterning the lower electrode layer, stacking and patterning the ferroelectric thin film, and stacking and patterning the upper electrode layer.

In versions (B) and (C), the upper electrode layer and the ferroelectric thin film may be patterned so that the upper electrode and the ferroelectric thin film extend over a single lower electrode, or they extend over a plurality of lower electrodes. In the former mode of patterning, $V_{ss}(V)$ or $V_{cc}(V)$, for example, is applied to the upper electrode. In the latter mode of patterning, a constant voltage, such as $(V_{cc}-V_{ss})/2(V)$, is applied to the upper electrode.

In the capacitor structure of a semiconductor memory cell or its fabricating method according to the invention, the conductive material forming the projection and the material forming the lower electrode layer may be of the same kind or different kinds of materials. Usable as a material of the lower electrode are, for example, ruthenium oxide ($RuO_x$) or iridium oxide ($IrO_x$), Ru, $Ru_2$/Ru-stacked structure, Ir, $IrO_2$/Ir-stacked structure, Pt, Pd, Pt/Ti-stacked structure, Pt/Ta-stacked structure, Pt/Ti/Ta-stacked structure, $La_{0.5}Sr_{0.5}CoO_3$(LSCO), and Pt/LSCO-stacked structure, $YBa_2Cu_3O_7$. Among them, ruthenium ($RuO_x$) or iridium oxide ($IrO_x$) are preferable. In layered structures, materials before "/" form upper layers (nearer to the ferroelectric thin film), and materials after "/" form lower layers (nearer to the insulation layer). For stacking the lower electrode layer, sputtering and pulse laser ablation may be used. For patterning the upper electrode layer, ion milling or RIE, for example, may be used.

After the ferroelectric thin film is stacked, annealing may be done to improve the crystallographic property of the ferroelectric thin film. In this case, impurity-doped polycrystalline silicon or tungsten, for example, is preferable as the conductive material forming the projection although usable is any other appropriate material resistant to the annealing temperature (approximately 800° C.).

The horizontally cross-sectional configuration of the column-shaped projection may be either rectangular, quasi-rectangular with rounded edges, circular, elliptical, or polygonal, for example.

A barrier metal layer made of Ti, TiN, TiN/Ti, or TaN for example, may be formed between the lower electrode layer and the projection. The barrier metal layer may be made by sputtering, for example. This layer is used ensure reliable adhesion of the lower electrode layer with the projection, improve the crystallographic property of the lower electrode layer, prevent diffusion of the material forming the lower electrode layer into the projection and prevent diffusion of the material forming the projection into the lower electrode layer.

The ferroelectric film may be stacked by, for example, chemical vapor deposition (metal organic chemical vapor deposition or CVD), or physical vapor deposition (vapor deposition including laser ablation, or sputtering). For patterning the ferroelectric thin film, RIE may be used, for example.

A Bi layer-structured perovskite-type ferroelectric thin film is an example of the ferroelectric thin film used here. Bi-layered structure perovskite-type ferroelectric materials belong to the group of non-stoichiometric compounds, and have a generosity to composition deviation in both sites of a metal element and an anion (O, etc.) element. Moreover, they often exhibit optimum electric characteristics when slightly offset from stoichiometric compositions. Bi-layered structure perovskite-type ferroelectric materials can be expressed by the general formula $(Bi_2O_2)^{2+}(A_{m-1}B_mO_{3m+1})^{2-}$ where "A" is one metal element selected from the group consisting of Bi, Pb, Ba, Sr, Ca, Na, K, Cd, and so forth, and "B" is one element selected from the group consisting of Ti, Nb, Ta, W, Mo, Fe, Co and Cr, or a combination of a plurality of these elements latitude in an arbitrary ratio. m is 1 or any larger integer.

Alternatively, the Bi-layered structure perovskite-type ferroelectric thin film preferably includes as its main crystal phase a crystal phase expressed by (1)

(where $1.7 \leq X \leq 2.5$, $0.6 \leq Y \leq 1.2$, $0 \leq Z \leq 1.0$ and $8.0 \leq d \leq 10.0$). "(Sr, Ca, Ba)" means one element selected from the group consisting of Sr, Ca and Ba. Alternatively, the ferroelectric thin film preferably includes as its main crystal phase a crystal phase expressed by (2)

(where $1.7 \leq X \leq 2.5$, $0.6 \leq Y \leq 1.2$ and $8.0 \leq d \leq 10.0$). In these cases, the ferroelectric thin film preferably includes a crystal phase expressed by Equation (1) or Equation (2) as its main crystal phase by a ratio not less than 85%. The ferroelectric thin film containing a crystal phase expressed by Equation (1) or Equation (2) as its main crystal phase may include a slight amount of an oxide of Bi, oxide of Ta or Nb, and/or complex oxide of Bi, Ta and Nb. Examples of stoichiometric compositions of the ferroelectric thin film expressed having the composition expressed by Equation (1) are $Bi_2SrTa_2O_9$, $Bi_2SrNb_2O_9$, $Bi_2BaTa_2O_9$ and $Bi_2SrTaNbO_9$. Also usable as the ferroelectric thin film are $Bi_4SrTi_4O_{15}$, $Bi_4Ti_3O_{12}$, and $Bi_2PbTa_2O_9$, for example, and ratios of respective metal elements can here again be changed within an extent not changing the crystal structure.

Alternatively, usable as the material forming the ferroelectric thin film are $PbTiO_3$, lead zirconate titanate which is a solid solution of $PbZrO_3$ and $PbTiO_3$ having a perovskite structure (PZT, $Pb(Zr_{1-y}Ti_y)O_3$ (where $0<y<1$)), and a PZT compound such as PLZT, which is a metal oxide made by adding La to PZT, PNZT, which is a metal oxide made by adding Nb to PZT.

The upper electrode layer in the capacitor structure of a semiconductor memory cell according to the invention may be made of, for example, $RuO_x$, $IrO_x$, Ru, $Ru_2$/Ru-stacked structure, Ir, $IrO_2$/Ir-stacked structure, Pt, Pd, Pt/Ti-stacked structure, Pt/Ta-stacked structure, Pt/Ti/Ta-stacked structure, $La_{0.5}Sr_{0.5}CoO_3$ (LSCO), Pt/LSCO-stacked structure, or $YBa_2Cu_3O_7$. In layered structures, materials before "/" form lower layers (nearer to the ferroelectric thin film), and materials after "/" form upper layers (nearer to the plate line). The upper electrode may be used also as the plate line, or the plate line may be made independently of the upper electrode. The upper electrode layer can be stacked by sputtering or pulse laser ablation. For patterning the upper electrode layer, ion milling or Rie, for example, may be used.

Usable as the material of the insulation layer are known materials, such as $SiO_2$, BPSG, PSG, BSG, AsSG, PbSG, SbSG, NSG, SOG, LTO (Low Temperature Oxide, low temperature CVD-$SiO_2$), SiN and SiON, or their stacked structures.

Possible forms of the semiconductor memory cell having the capacitor structure according to the invention are a nonvolatile memory cell (FERAM) and DRAM.

In the present invention, since the lower electrode is made of the column-shaped projection of a conductive material formed on the insulation layer and the lower electrode layer covering the projection, the area of the ferroelectric thin film formed on the lower electrode layer can be increased. Additionally, since the ferroelectric thin film is formed on the lower electrode layer as originally formed. Since the lower electrode layer in this status does not have damages or roughness on its surface and has a good surface morphology, degradation of characteristics of the ferroelectric thin film can be prevented reliably.

The above and other objects and features of the present invention will become apparent from the following detailed description and the appended claims with reference to the accompanying drawings.

DESCRIPTION OF THE PREFERRED EMBODIMENTS

Some embodiments of the invention are described below with reference to the drawings.

First Embodiment

Figure 3:
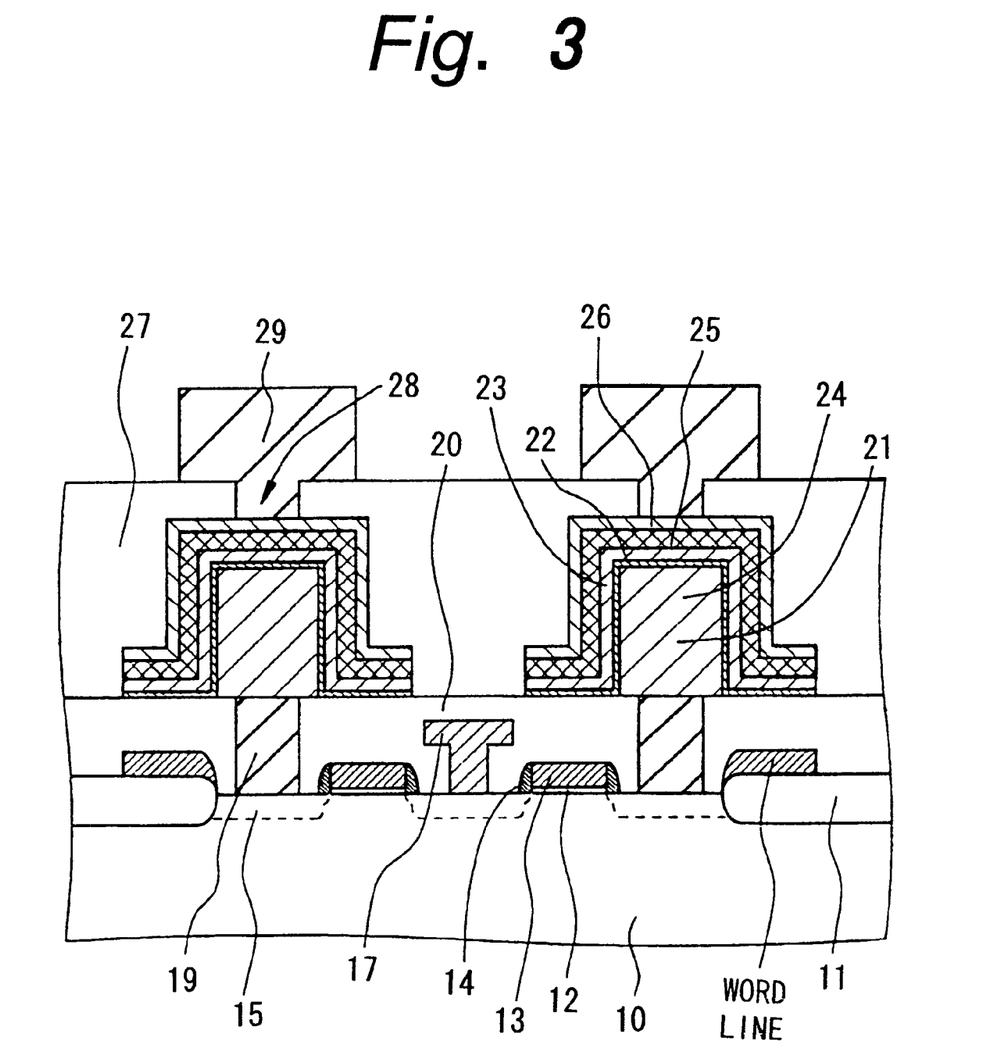
FIG. 3 is a schematic fragmentary cross-sectional view of a capacitor structure of a semiconductor memory cell according to the first embodiment of the invention.
Figure 4A:
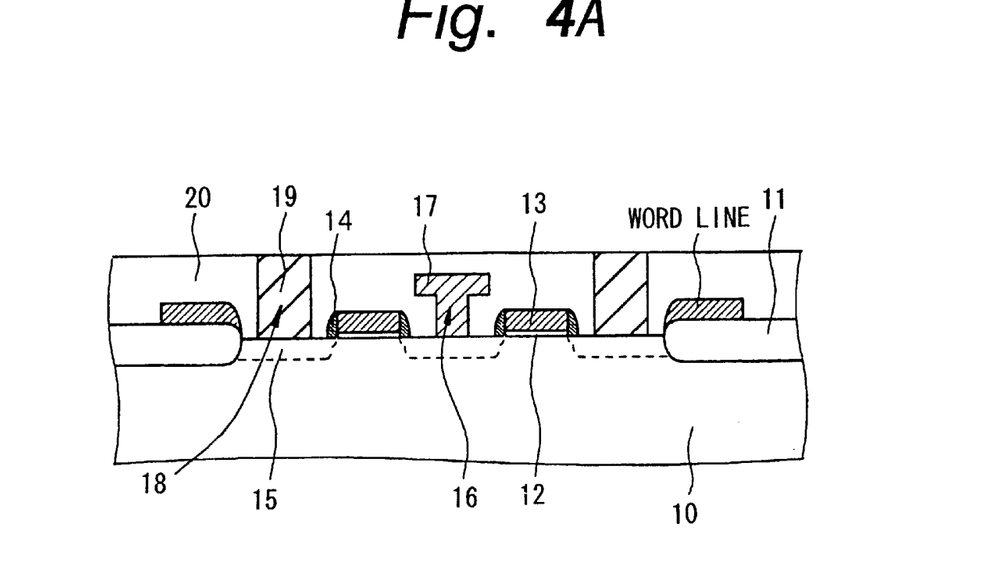
FIGS. 4A through 4D are schematic fragmentary cross-sectional views of a semiconductor substrate and other elements for explaining a method for fabricating the capacitor structure of the semiconductor memory cell according to the first embodiment.
Figure 4B:
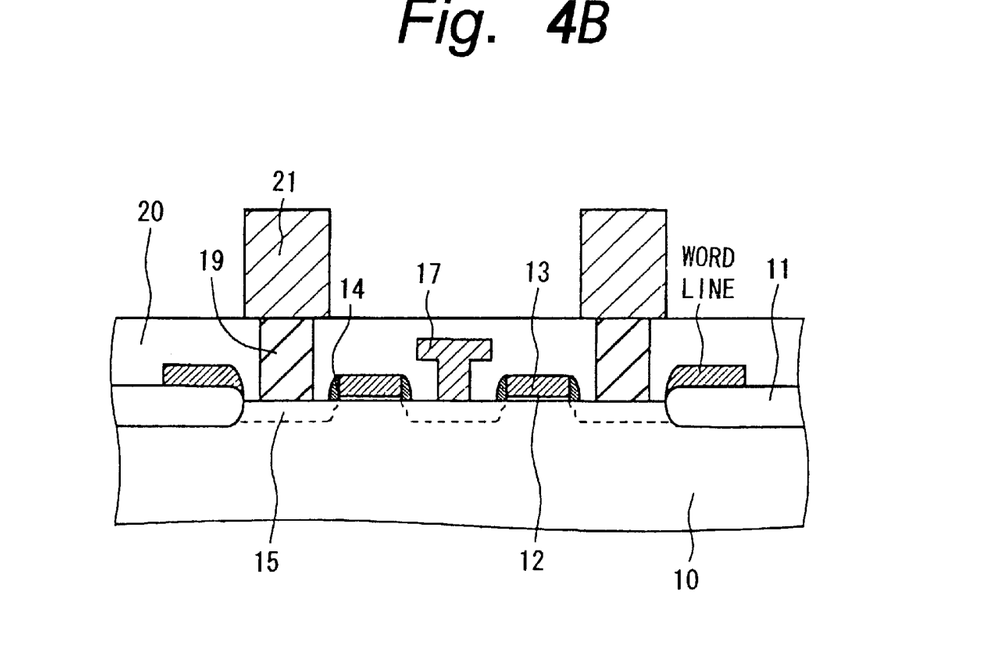
Figure 4C:
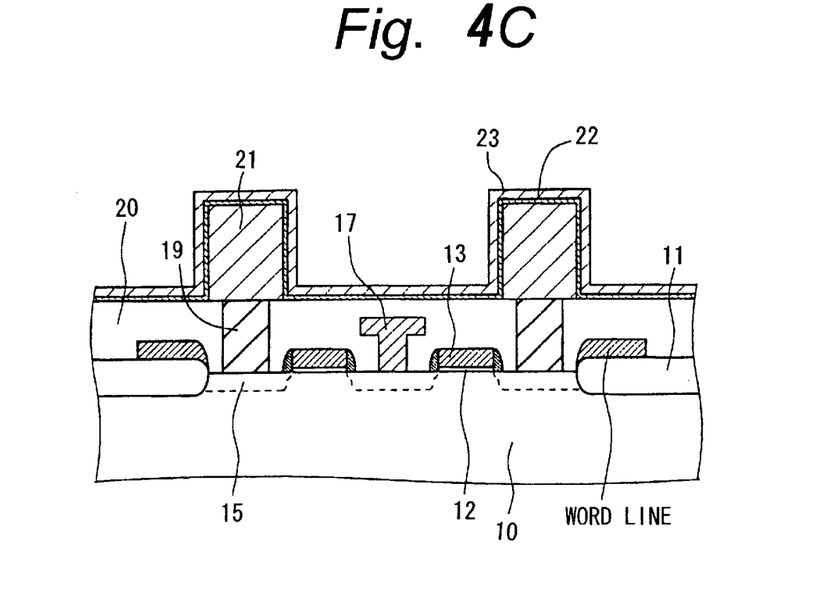
Figure 4D:
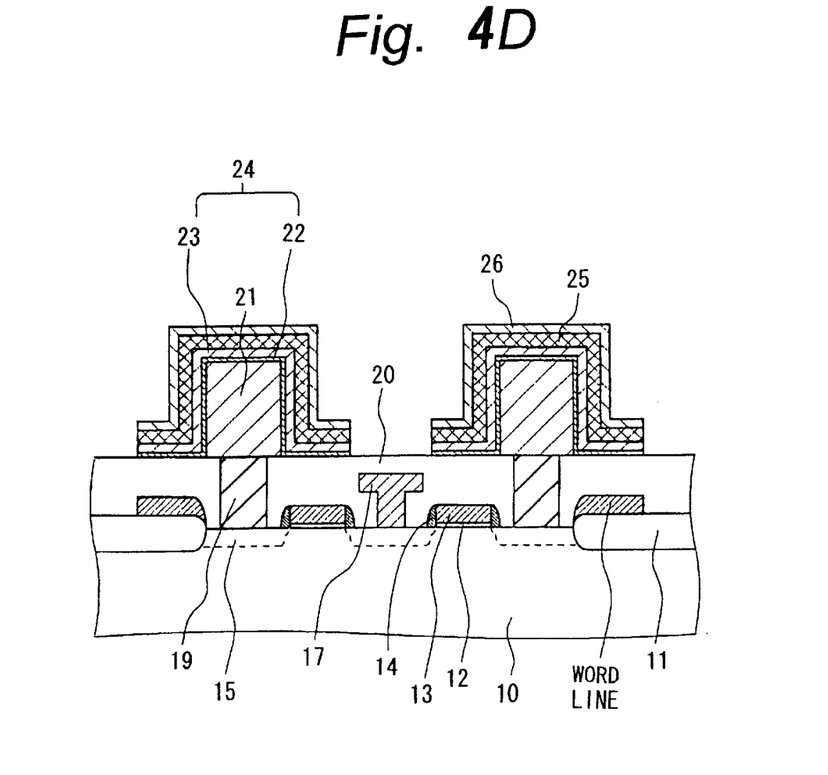

FIG. 3 shows a schematic fragmentary cross-sectional view of a capacitor structure of a semiconductor memory cell according to the first embodiment of the invention. The capacitor structure of the semiconductor memory cell includes a lower electrode 24 formed on an insulation layer 20 made of BPSG, for example, a capacitor insulation film 25 made of a ferroelectric thin film on the lower electrode 24, and an upper electrode 26 formed on the capacitor insulation film 25. The lower electrode 24 includes a column-shaped projection 21 made of a conductive material on the insulation layer 20, and a lower electrode layer 23 covering the projection 21. The ferroelectric film is formed on the lower electrode layer 23 as originally stacked. The horizontal cross-sectional configuration of the column-shaped projection 21 is an rectangle with its edges slightly rounded. In the first embodiment, the conductive material forming the projection 21 is poly-crystalline silicon doped with an impurity, and the lower electrode layer is made of ruthenium ($RuO_x$). Formed between the lower electrode layer 23 and the projection 21 is a barrier metal layer 22 made by stacking a TiN layer and Ti layer. In the first embodiment of the invention, the capacitor insulation film 25 and the upper electrode 26 lie on a single lower electrode 24. In the capacitor structure with this construction, the upper electrode 26 is connected to a plate line 29, and $V_{ss}(V)$ or $V_{cc}(V)$, for example, is applied to the upper electrode 26 via the plate line 29. Numeral 27 denotes an insulation film.

Formed below the insulation layer 20 is a selection transistor. The selection transistor lies between device isolating regions 11 formed in a semiconductor substrate 10, and includes a gate oxide film 12, gate electrode 13 and source/drain regions 15 formed along the surface of the semiconductor substrate 10. One of the source/drain regions 15 is connected to the projection 21 of the lower electrode 24 via a connection hole (contact hole) 19. The other of the source/drain regions 15 is connected to the bit line 17. $V_{cc}$ (V) or $V_{ss}$ (V), for example, is applied to the bit line 17. Although the bit line 17 actually extends in right and left directions bypassing the connection hole 19, the drawing does not show these parts of the bit line. The gate electrode 13 is used also as the word line. By applying $V_{ss}$ (V) to the plate line 29 and $V_{cc}$ (V) to the bit line 17, or by applying $V_{cc}$ (V) to the plate line 29 and $V_{ss}$ (V) to the bit line 17, data "0" or "1" can be written in the ferroelectric capacitor insulation film 25.

Explained below is a method for fabricating the capacitor structure of the semiconductor memory cell according to the invention with reference to schematic fragmentary cross-sectional views of FIGS. 4A through 4D.

Step 100

First formed is the selection transistor on the semiconductor substrate 10. For this purpose, device isolating regions 11 having a LOCOS structure, for example, are formed by a known method. Device isolating regions may have a trench structure. After that, the surface of the semiconductor substrate 10 is oxidized by a pyrogenic method, for example, to form the gate oxide film 12. Thereafter, a poly-crystalline silicon layer doped with an impurity is stacked on the entire surface by CVD, and then patterned to form the gate electrode 13. The gate electrode 13 commonly forms the word line. Subsequently, ions are injected into the semiconductor substrate 10 to form a LDD structure. After that, a $SiO_2$ film is stacked on the entire surface by CVD, and then etched back to form a gate side wall 14 on the lateral surface of the gate electrode 13. After ions are again injected into the semiconductor substrate 10, the substrate 10 is annealed for activating the ion-implanted impurity to form the source/drain regions 15. After that, a first insulation layer made of $SiO_2$ is stacked by CVD, and an opening 16 is formed in the first insulation layer above one of the other of the source/drain regions 15 by RIE. An impurity-doped poly-crystalline silicon layer is next stacked on the first insulation layer including the interior of the opening 16 by CVD. The poly-crystalline silicon layer on the first insulation layer is thereafter patterned to form the bit line 17. Subsequently, a second insulation layer made of BPSG is stacked on the entire surface by CVD under conditions as shown below. The second insulation layer made of BPSG in a nitrogen gas atmosphere at 900° C. for 20 minutes, for example, after it is stacked. Moreover, where appropriate, the top surface of the second insulation layer is preferably polished chemically-mechanically by chemical-mechanical polishing, for example, to smooth the second insulation layer. Hereinbelow, the first insulation layer and the second insulation layer, as a whole, are called an insulation layer 20.

Gas used: $SiH_4/PH_3/B_2H_6$

Stacking temperature: 400° C.

Reaction pressure: normal pressure

Step 110

In the next step, an opening 18 is formed in the insulation layer 20 above one of the source/drain regions 15 by RIE, and tungsten is applied into the opening 18 to complete the connection hole (contact plug) 19. That is, a tungsten film is stacked on the entire surface including the opening 18, and then etched back. As a result, the semi-product as schematically shown by the fragmentary cross-sectional view in FIG. 4A can be obtained. The drawings integrally illustrate the first insulation layer and the second insulation layer as a single insulation layer 20. Although the bit line 17 actually extends in right and left directions bypassing the connection hole 19, the drawings do not show these parts of the bit line. Conditions of CVD used for stacking the tungsten layer are shown below. Note here that, before stacking the tungsten layer, a Ti layer and a TiN layer are stacked sequentially on the insulation layer 20 including the interior of the opening by magnetron sputtering, for example. These Ti and TiN layers are formed for the purpose of obtaining an ohmic low contact resistance, preventing damages to the semiconductor substrate during blanket tungsten CVD, and for ensuring better adhesion of tungsten. Illustration of these Ti and TiN layers is omitted in the drawings.

TABLE 1

Sputtering conditions of Ti layer (20 nm thick)

| | |
|---|---|
| Process gas: | Ar = 35 sccm |
| Pressure: | 0.52 Pa |
| RF power: | 2 kW |
| Heating of substrate: | none |

Sputtering conditions of TiN layer (100 nm thick)

| | |
|---|---|
| Process gas: | $N_2$/Ar = 100/35 sccm |
| Pressure: | 1.0 Pa |
| RF power: | 6 kW |
| Heating of substrate: | none |

TABLE 2

CVD stacking conditions of tungsten layer

| | |
|---|---|
| Gas used: | $WF_6/H_2$/Ar = 40/400/2250 sccm |
| Pressure: | 10.7 kPa |
| Stacking temperature: | 450° C. |

TABLE 3

Etching conditions of tungsten layer, and TiN and Ti layers

First-step etching: etching of tungsten layer

| | |
|---|---|
| Gas used: | $SF_6$/Ar/He = 110:90:5 sccm |
| Pressure: | 46 Pa |
| RF power: | 275 W |

Second-step etching: etching of TiN and Ti layers

| | |
|---|---|
| Gas used: | Ar/$Cl_2$ = 75/5 sccm |
| Pressure: | 6.5 Pa |
| RF power: | 250 W |

Step 120

Next stacked is the lower electrode on the insulation layer 20. For this purpose, first stacked is an impurity-doped poly-crystalline silicon layer on the entire surface. Afar that, the poly-crystalline silicon layer is patterned into the column-shaped projection 21 (see FIG. 4B). Then, the barrier metal layer 22 stacking TiN and Ti layers is formed under the conditions shown in Table 1. The Ti layer underlies, and TiN layer overlies. Subsequently, the lower electrode 23 made of $RuO_X$ if stacked on the barrier metal layer 22 by DC sputtering using Ru (ruthenium) as the target and $O_2$/Ar as the process gas. As a result, the structure schematically shown in the fragmentary cross-sectional view of FIG. 4C can be obtained. The barrier metal layer 22 is illustrated as a single layer.

Step 130

In the next step, a ferroelectric thin film made of a Bi-layered structure perovskite-type ferroelectric material is stacked on the entire surface by MOCVD. Conditions for stacking a ferroelectric thin film expressed by $Bi_XSr_YTa_2O_d$ in Expression (2) are shown in Table 4.

TABLE 4

| | |
|---|---|
| Source materials: | $Sr(C_{11}H_{19}O_2)_2$ |
| | $Bi(C_6H_5)_3$ |
| | $Ta(OC_2H_5)_5$ |
| Stacking temperature: | 650 through 750° C. |
| Stacking pressure: | 27 through 400 Pa |
| Oxygen concentration: | 50% |

Alternatively, the ferroelectric thin film expressed by $Bi_XSr_YTa_2O_d$ in Equation (2) can be stacked on the entire surface by pulse ablation or RF sputtering. Exemplary conditions therefor are shown below. Post baking is preferably done in an oxygen atmosphere at 800° C. for one hour after the ferroelectric thin film expressed by $Bi_XSr_YTa_2O_d$ in Equation (2) is stacked.

TABLE 5

Stacking by pulse laser ablation

| | |
|---|---|
| Target: | $Bi_XSr_YTa_2O_d$ |
| Laser used: | KrF excimer laser (wavelength 248 nm, pulse width 25 nanoseconds, 5 Hz) |
| Stacking temperature: | 500° C. |
| Oxygen concentration: | 3 Pa |

TABLE 6

Stacking by RF sputtering

| | |
|---|---|
| Target: | $Bi_2SrTa_2O_9$ ceramic target |
| RF power: | 1.2 W through 2.0 W per 1 $cm_2$ of the target |
| Atmosphere pressure: | 0.2 to 1.3 Pa |
| Stacking temperature: | Room temperature to 600° C. |
| Process gas: | $Ar/O_2$ with a flow ratio from 2/1 to 9/1 |

Step 140

In the next step, similarly to Step 120, after the lower electrode made of $RuO_X$ is stacked, the upper electrode layer, ferroelectric thin film, lower electrode layer 23 and barrier metal layer 22 are patterned by RIE, for example. As a result, the capacitor insulation film 25 in form of the ferroelectric thin film on the lower electrode 24 and the upper electrode 26 patterned from the $RuO_X$ upper electrode layer can be obtained. Thus, the structure schematically shown in the fragmentary cross-sectional view of FIG. 4D. Note here that the ferroelectric thin film can be stacked on the lower electrode layer 23 maintaining the originally stacked surface condition, and deterioration of its P-E hysteresis loop characteristic can be prevented.

Step 150

In the next step, the insulation film 27 is deposited on the entire surface, and an opening 28 is made in the insulation film 27 above the upper electrode 26 by RIE. Them, a metal wiring material layer made of an aluminum alloy, for example, is formed on the insulation film 27 including the interior of the opening 28 by sputtering, and subsequently patterned into the plate line 29. Thus, the structure schematically shown in the fragmentary cross-sectional view in FIG. 3 can be obtained.

Figure 5:
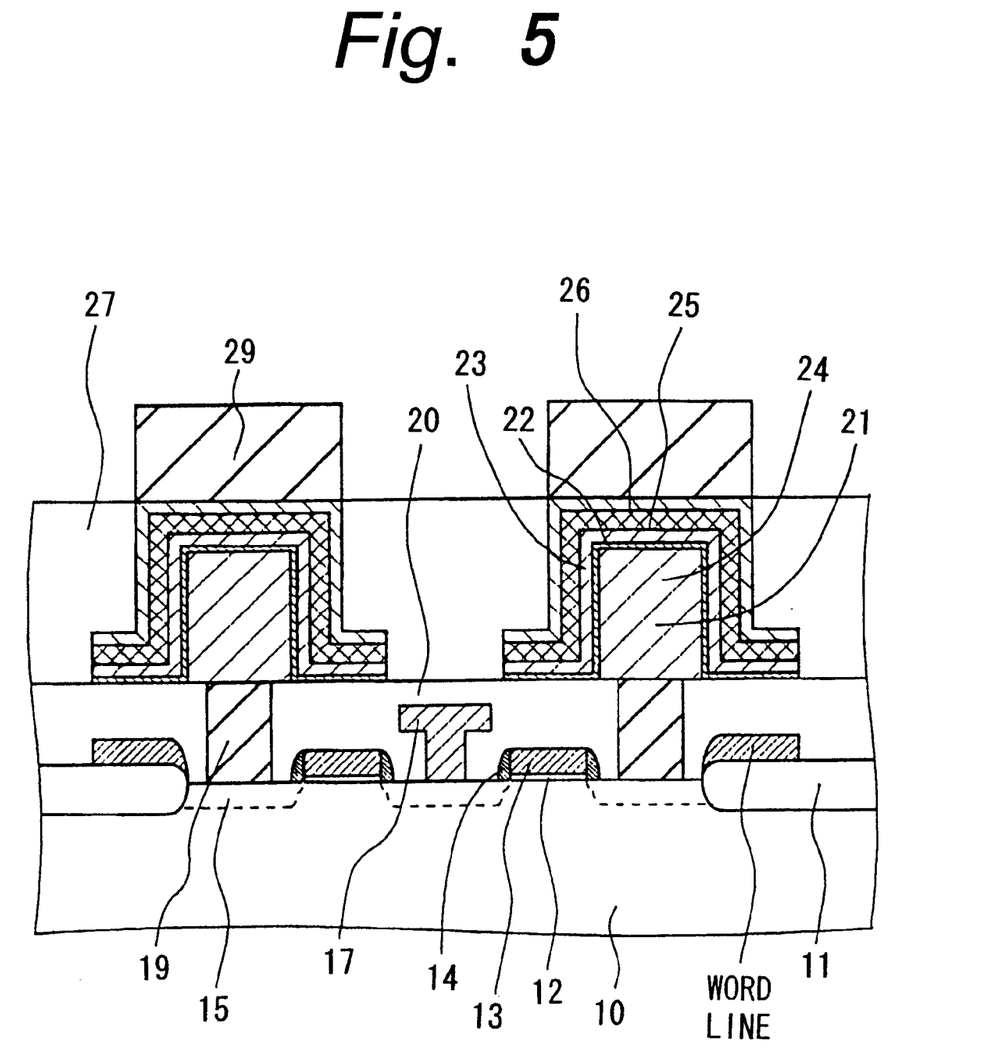
FIG. 5 is a schematic fragmentary cross-sectional view of a modified version of the capacitor structure of the semiconductor memory cell according to the first embodiment of the invention.

The plate line 29 may be formed also by stacking the insulation film 27 on the entire surface, then etching back it to expose the top part of the upper electrode 26, then forming the metal wiring material layer made of an aluminum alloy, for example on the insulation film 27 including the exposed top part of the upper electrode 26 by sputtering. The structure thus obtained is shown schematically in the fragmentary cross-sectional view of FIG. 5. In the structure shown in FIG. 5, the upper electrode 26 is connected directly to the plate line 29, not via the contact hole.

Second embodiment

The first embodiment 1 sequentially stacks the lower electrode layer, ferroelectric thin film and upper electrode layer, and thereafter patterns these layers simultaneously. In contrast, the second embodiment stacks and patterns the lower electrode layer, then stacks the ferroelectric thin film and the upper electrode layer sequentially, and then patterns the upper electrode layer and the ferroelectric thin film simultaneously. In the capacitor structure of the semiconductor memory cell according the second embodiment, the capacitor insulation film 25 and the upper electrode 26 extend over a plurality of lower electrodes 24. The capacitor structure of the semiconductor memory cell so constructed according to the second embodiment is schematically shown in the fragmentary cross-sectional view of FIG. 6.

Figure 7A:
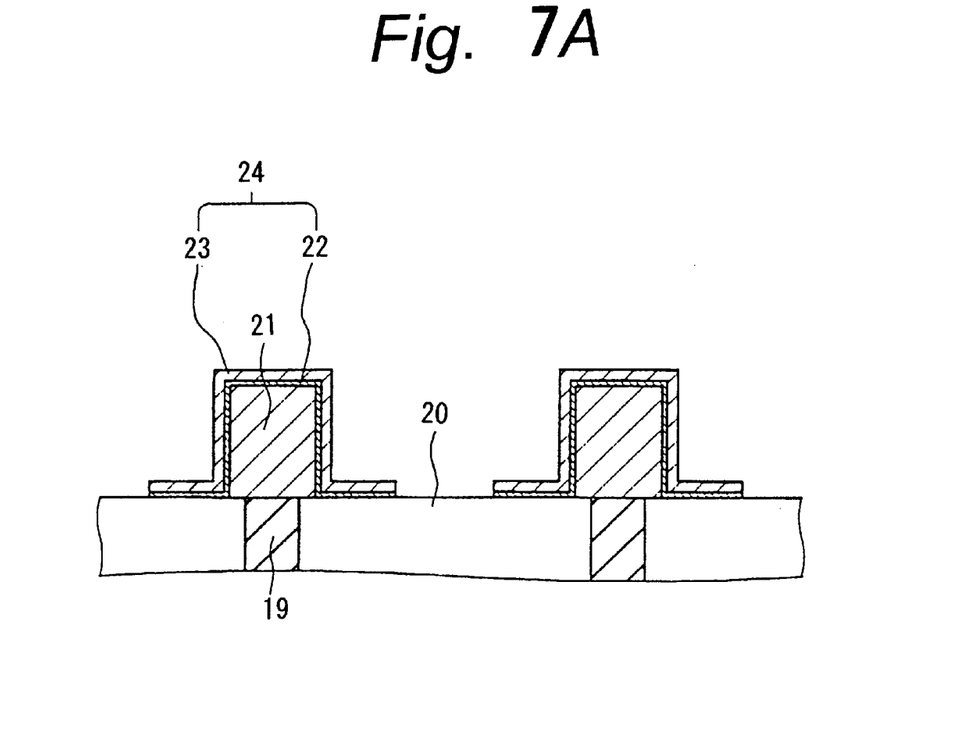
FIGS. 7A and 7B are schematic fragmentary cross-sectional view of the capacitor structure of the semiconductor memory according to the invention under a process for fabrication.
Figure 7B:
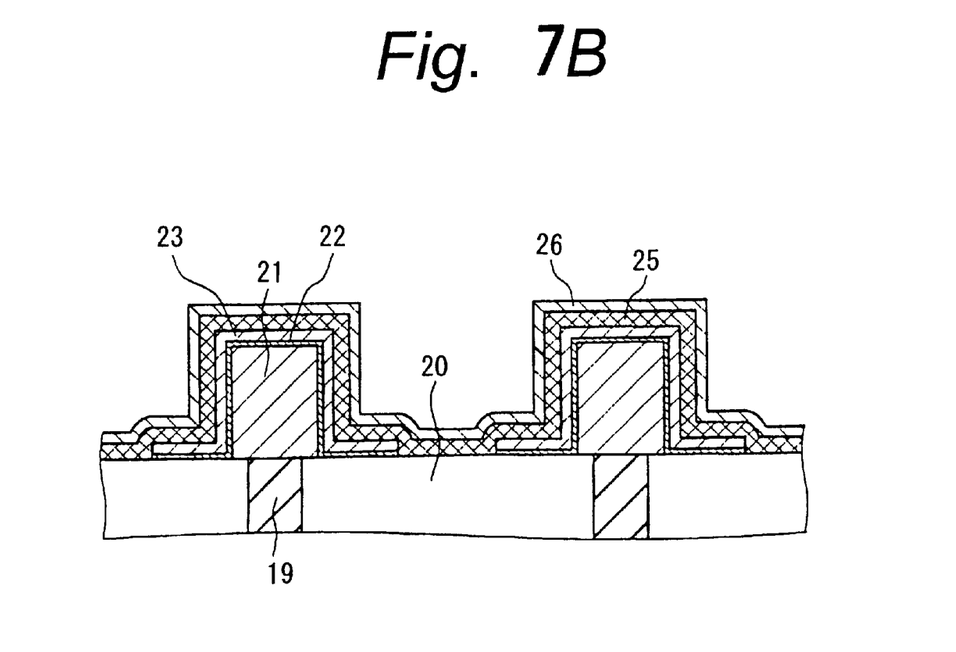

In the method for fabricating the capacitor structure of the semiconductor memory cell according to the second embodiment, Steps 100, Step 110 and Step 120 of the first embodiment are executed. After that, the lower electrode layer 23 and the barrier metal layer 22 are patterned. As a result, the structure shown in FIG. 7A is obtained. In FIGS. 7A and 7B, the selection transistor is not illustrated. The surface of the lower electrode layer 23 for stacking the ferroelectric thin film thereon is coated by a resist material during etching of the lower electrode layer 23. Therefore, the ferroelectric thin film can be stacked on the lower electrode layer 23 as originally stacked, and deterioration of the P-E hysteresis loop characteristic of the ferroelectric thin film can be prevented.

After that, Step 130 and Step 140 of the first embodiment are continued, and the upper electrode layer and the ferroelectric thin film are patterned by RIE, for example. As a result, the capacitor insulation film 25 in form of the ferroelectric thin film formed on the lower electrode 24, and the upper electrode 26 patterned from the upper electrode layer made of $RuO_X$ are formed. Thus, the structure schematically shown in the fragmentary cross-sectional view of FIG. 7B is obtained. In the process of patterning the upper electrode layer and the ferroelectric thin film, they are patterned so that the capacitor insulation film 25 and the upper electrode 26 overlie a plurality of (for example, eight) lower electrodes 24. After that, by executing Step 150 of the first embodiment, the structure schematically shown in the fragmentary cross-sectional view in FIG. 6 can be obtained.

Figure 6:
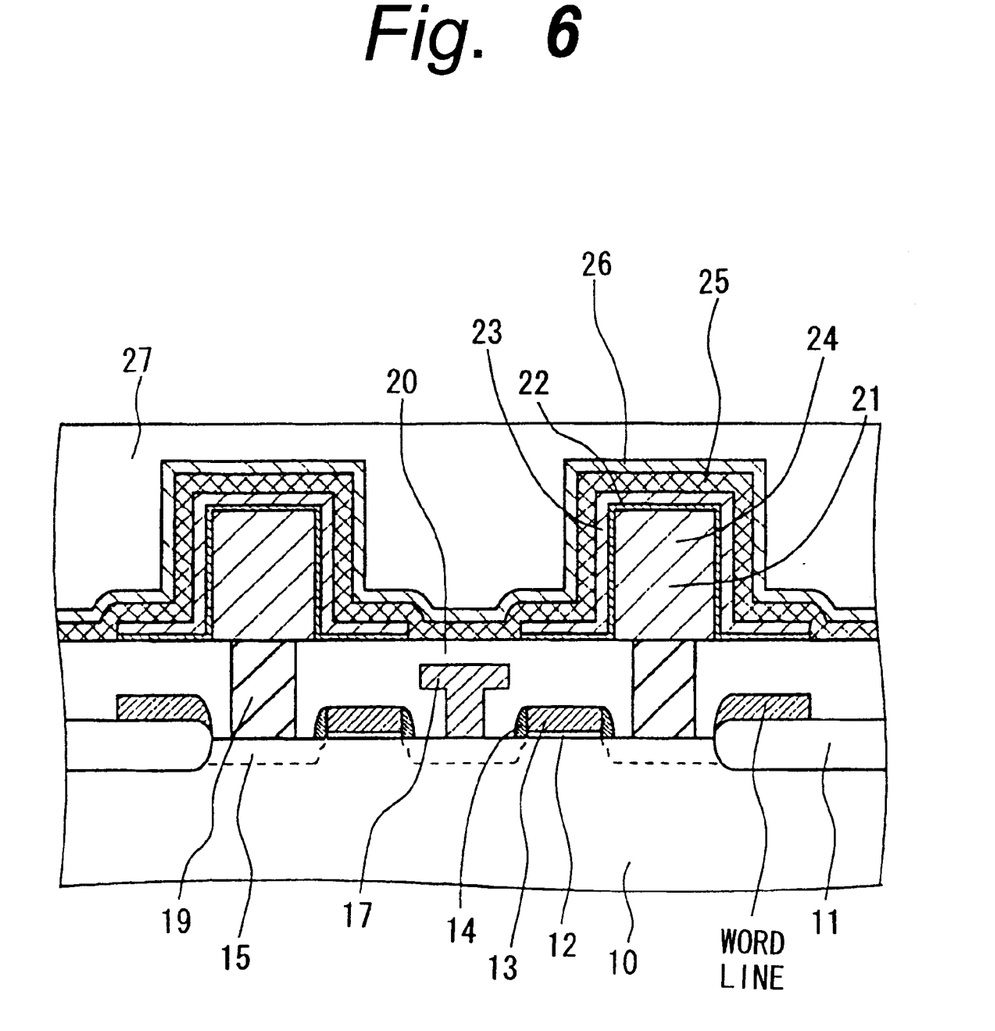
FIG. 6 is a schematic fragmentary cross-sectional view of a capacitor structure of a semiconductor memory cell according to the second embodiment of the invention.

By employing this structure where the capacitor insulation film 25 and the upper electrode 26 extend over a plurality of lower electrodes 24, namely, the structure where a single plate electrode is connected to one memory block including a plurality of semiconductor memory cells, the semiconductor memory cell can be reduced in scale, and high-integrated semiconductor memory can be realized. In capacitor structures having this construction, the upper electrode 26 is commonly used as the plate electrode, and a constant voltage, such as $(V_{cc}-V_{ss})/2(V)$ is applied to the upper electrode 26. Thus, by applying $V_{cc}(V)$ or $V_{ss}(V)$ to the bit line 17, data "0" or "1" can be written in the ferroelectric thin film as the capacitor insulation film 25.

Although the invention has been described above by way of some specific embodiments, the invention is not limited to these examples. The gate electrode 13 and the bit line 17 may be made of a polycide or a metal silicide in lieu of the poly-silicon layer. Also usable as the insulation film 20 are known insulation materials, such as PSG, BSG, AsSG, PbSG, SbSG, SOG, SiON, SiN, and so forth, of their stacked structures, instead of BPSG or $SiO_2$. The order of the step of forming the bit line 17 may be determined appropriately. For example, the bit line can be made after the plate line 29 is formed.

The ferroelectric thin film may be made of PZT or PZLT instead of a Bi-layered structure perovskite-type ferroelectric material. Conditions for stacking PZT or PZLT by magnetron sputtering are shown in Table 7.

TABLE 7

| | |
|---|---|
| Target: | PZT or PZLT |
| Process gas: | $Ar/O_2$ = 90/10 in vol % |
| Pressure: | 4 Pa |
| Power: | 50 W |
| Stacking temperature: | 500° C. |

TABLE 8

| | |
|---|---|
| Target: | PZT or PLZT |
| Laser used: | KrF excimer laser (wavelength 248 nm, pulse width 25 nanoseconds, 3 Hz) |
| Output energy: | 400 mJ (1.1 $J/cm^2$) |
| Stacking temperature: | 550 to 600° C. |
| Oxygen concentration: | 40 to 120 Pa |

The lower electrode layer 23 and the upper electrode 26 can be made of platinum. Conditions for stacking a Pt film by RF magnetron sputtering are shown in Table 9.

TABLE 9

| | |
|---|---|
| Anode voltage: | 2.6 kV |
| Input power: | 1.1 to 1.6 W/cm$^2$ |
| Process gas: | Ar/O$_2$ = 90/10 sccm |
| Pressure: | 0.7 Pa |
| Stacking temperature: | 600 to 750° C. |
| Stacking rate: | 5 to 10 nm/min |

Alternatively, the lower electrode layer 23 and the upper electrode 26 may be made of LSCO, for example. Stacking conditions therefor by pulse laser ablation are shown in Table 10.

TABLE 10

| | |
|---|---|
| Target: | LSCO |
| Laser used: | KrF excimer laser (wavelength 248 nm, pulse width 25 nanoseconds, 3 Hz) |
| Output energy: | 400 mJ (1.1 J/cm$^2$) |
| Stacking temperature: | 550 to 600° C. |
| Oxygen concentration: | 40 to 120 Pa |

The connection hole (contact plug) 19 can be made either by plugging the opening 18 made in the insulation layer 20 with a metal wiring material, such as Ti, Pt, Pd, Cu, Tiw, TiNW, WSi$_2$, MoSi$_2$, or other metal with a high melting point, or a metal silicide, or by plugging it with an impurity-doped poly-crystalline silicon. The top surface of the connection hole may be in the common level with the surface of the insulation layer 20, or may be extended along the surface of the insulation film 20.

The method for fabricating the capacitor structure of the semiconductor memory cell according to the invention can be applied not only to nonvolatile memory cells using a ferroelectric thin film (FERAM) or DRAM. For application to DRAM, polarization of the ferroelectric thin film is utilized within a range of applied voltages not causing inversion of polarization. That is, here is used the characteristic that a difference ($P_{max}$–$P_r$) between the maximum (saturation) polarization $P_{max}$ by an external electric field and the residual polarization $P_r$ upon the external field being 0 has a constant relation (substantially proportional relation) with the source voltage. The polarization of the ferroelectric thin film always remains between the saturation polarization ($P_{max}$) and the residual polarization ($P_r$), and does not invert. Data is maintained by refresh operation.

According to the invention, since the area of the ferroelectric thin film formed on the lower electrode layer can be increased, accumulated electric charge in the capacitor structure can be increased. Moreover, the ferroelectric thin film is formed on the lower electrode layer as originally stacked. The lower electrode layer in this status does not include damages or roughness on its surface, and therefore exhibits a good surface morphology. As a result, the invention can prevent deterioration of the characteristics of the ferroelectric film, and can fabricate a capacitor structure of a semiconductor memory cell with a high reliability.

Having described a specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A capacitor structure of a semiconductor memory cell, comprising:
   a lower electrode formed on an insulation layer, said lower electrode comprising a column-shaped projection made of a conductive material formed on said insulation layer, a lower electrode layer made of conductive material covering said column-shaped projection;
   a capacitor insulation film in the form of a ferroelectric thin film formed on said lower electrode; and
   an upper electrode formed on said capacitor insulation layer.

2. The capacitor structure of a semiconductor memory cell according to claim 1 wherein said ferroelectric thin film is expressed by the general formula $(Bi_2O_2)^{2+}(A_{m-1}B_mO_{3m+1})^{2-}$.

3. The capacitor structure of a semiconductor memory cell according to claim 1 wherein said ferroelectric thin film is expressed by the general formula $Bi_X(Sr, Ca, Ba)_Y(Ta_z, Nb_{1-z})_2O_d$, where $1.7 \leq X \leq 2.5$, $0.6 \leq Y \leq 1.2$, $0 \leq Z \leq 1.0$ and $8.0 \leq d \leq 10.0$.

4. The capacitor structure of a semiconductor memory cell according to claim 1 wherein said ferroelectric thin film is expressed by the general formula $Bi_XSr_YTa_2O_d$, where $1.7 \leq X \leq 2.5$, $0.6 \leq Y \leq 1.2$ and $8.0 \leq d \leq 10.0$.

5. The capacitor structure of a semiconductor memory cell according to claim 1 wherein said ferroelectric thin film is made of a PZT compound.

6. The capacitor structure of a semiconductor memory cell according to claim 1 wherein said conductive material forming said projection is polycrystalline silicon doped with an impurity or tungsten, and said lower electrode layer is made of ruthenium oxide or iridium oxide.

7. A capacitor structure of a semiconductor memory cell, comprising:
   a lower electrode formed on an insulation layer, said lower electrode comprising a column-shaped projection made of a conductive material formed on said insulation layer, a barrier metal layer formed over said column-shaped projection, and a lower electrode layer made of conductive material covering said barrier metal layer;
   a capacitor insulation film in the form of a ferroelectric thin film formed on said lower electrode; and
   an upper electrode formed on said capacitor insulation layer.

8. The capacitor structure of a semiconductor memory cell according to claim 7, wherein said conductive material forming said projection is polycrystalline silicon doped with an impurity or tungsten, and said lower electrode layer is made of ruthenium oxide or iridium oxide.

9. The capacitor structure of a semiconductor memory cell according to claim 7, wherein said ferroelectric thin film is expressed by the general formula $(Bi_2O_2)^{2+}(A_{m-1}B_mO_{3m+1})^{2-}$.

10. The capacitor structure of a semiconductor memory cell according to claim 7, wherein said ferroelectric thin film is expressed by the general formula $Bi_X(Sr, Ca Ba)_Y(Ta_Z, Nb_{1-z})_2O_d$, where $1.7 \leq x \leq 2.5$, $0.6 \leq Y \leq 1.2$, $0 \leq Z \leq 1.0$ and $8.0 \leq d \leq 10.0$.

11. The capacitor structure of a semiconductor memory cell according to claim 7, wherein said ferroelectric thin film is expressed by the general formula $Bi_XSr_YTa_ZO_d$, where $1.7 \leq X \leq 2.5$, $0.6 \leq Y \leq 1.2$ and $8.0 \leq d \leq 10.0$.

12. The capacitor structure of a semiconductor memory cell according to claim 7 wherein said ferroelectric thin film is made of a PZT compound.

* * * * *